US007800595B2

(12) United States Patent
Hill

(10) Patent No.: US 7,800,595 B2
(45) Date of Patent: Sep. 21, 2010

(54) PIEZOELECTRIC TRANSDUCER

(75) Inventor: Nicholas P. R. Hill, Cambridge (GB)

(73) Assignee: 3M Innovative Properties Company, Saint Paul, MN (US)

( * ) Notice: Subject to any disclaimer, the term of this patent is extended or adjusted under 35 U.S.C. 154(b) by 1615 days.

(21) Appl. No.: 10/739,471

(22) Filed: Dec. 18, 2003

(65) Prior Publication Data

US 2005/0134574 A1   Jun. 23, 2005

(51) Int. Cl.
*G06F 3/043* (2006.01)
(52) U.S. Cl. ..................................... 345/177; 178/18.04
(58) Field of Classification Search ......... 345/173–178; 178/18.01–20.04
See application file for complete search history.

(56) References Cited

U.S. PATENT DOCUMENTS

| | | | |
|---|---|---|---|
| 3,150,275 A | 9/1964 | Lucy | |
| 4,129,799 A | 12/1978 | Green | |
| 4,228,532 A | 10/1980 | Sims | |
| 5,317,917 A | 6/1994 | Dufour | |
| 5,541,892 A | 7/1996 | Kobayashi et al. | |
| 5,831,371 A | 11/1998 | Bishop | |
| 5,936,207 A | 8/1999 | Kobayashi et al. | |
| 5,962,954 A | 10/1999 | Leers et al. | |
| 6,922,642 B2 * | 7/2005 | Sullivan | 702/56 |
| 2002/0135570 A1 | 9/2002 | Iisaka et al. | |
| 2003/0066692 A1 | 4/2003 | Devige et al. | |

FOREIGN PATENT DOCUMENTS

| | | |
|---|---|---|
| EP | 0753723 | 1/1997 |
| JP | 63268173 | 11/1988 |
| WO | WO 00/38104 | 6/2000 |
| WO | WO 01/48684 A2 | 7/2001 |
| WO | WO 03/005292 | 1/2003 |

OTHER PUBLICATIONS

U.S. Appl. No. 10/602,423, filed Jun. 24, 2003, Aufderheide.
"Efficient Piezoelectric Glide Transducer For Magnetic Recording Disk Quality Assurance"; IBM Technical Disclosure Bulletin; vol. 34, No. 4A; Sep. 1991.

* cited by examiner

*Primary Examiner*—Bipin Shalwala
*Assistant Examiner*—Steven E Holton
(74) *Attorney, Agent, or Firm*—Steven A. Bern

(57) ABSTRACT

The present invention provides a piezoelectric transducer that includes at least two poled piezoelectric regions disposed in a side-by-side arrangement and connected in series with the poling directions reversed through the series connection, meaning that the "north pole" of one region is connected to the "south pole" of an adjacent region. The at least two regions can be within the same piece of piezoelectric material, or can be separate pieces of piezoelectric material. Transducers of the present invention may be particularly suited to detecting vibrations such as bending waves in a plate. For example, transducers of the present invention may be affixed to a surface of a plate and used to detect vibrations caused by or affected by touches to the plate to determine information related to the touches, such a touch position.

11 Claims, 5 Drawing Sheets

PIEZOELECTRIC TRANSDUCER

This invention relates to poled piezoelectric transducers and to devices that utilize poled piezoelectric transducers for the emission or sensing of vibrations.

BACKGROUND

Piezoelectric devices are used to convert mechanical energy into electrical energy and electrical energy into mechanical energy. Mechanically stressing a piezoelectric device causes a charge imbalance in the device, setting up an electrical field that can be measured. Conversely, applying an electrical field across a piezoelectric device can induce a mechanical stress that can be used to controllably manipulate an object coupled to the device. In some applications, piezoelectric devices can be coupled to the surfaces of objects and used for detecting vibrations in the objects, emitting vibrations into the objects, or both. Examples of this include mechanically coupling piezoelectric devices to flat panels and using the devices to induce vibrations in the panels that lead to audible signals, thus converting the panels into loudspeaker devices. Likewise, panels can be used to receive vibrations that are sensed by piezoelectric devices coupled to the panel, thus converting the panels into microphones. Piezoelectric devices have also been used to detect vibrations induced in a plate by a touch to the plate. The detected vibrations can be used to determine the location of the touch.

SUMMARY OF THE INVENTION

The present invention provides a piezoelectric transducer that includes a plurality of poled piezoelectric regions connected in series from a first region to a last region and disposed in a side-by-side arrangement, each region having first and second surfaces and a poling direction pointing from the first surface to the second surface of that region, each pair of connected adjacent regions being electrically connected from the first surface of one of the adjacent regions to the second surface of the other of the adjacent regions. The transducer also includes a first terminal electrode disposed on the first surface of the first region and a second terminal electrode disposed on the second surface of the last region.

The present invention further provides a user input device that includes a touch plate and at least one piezoelectric transducer disposed on a surface of the touch plate. The transducer includes a series of poled piezoelectric regions disposed in a side-by-side arrangement, each region having a poling direction defined by a north pole and a south pole, the poling direction of each region being perpendicular to the surface of the touch plate, the regions connected in series such that the north pole of one region is electrically connected to the south pole of the next region in the series.

The present invention also provides a method for increasing voltage sensitivity of a piezoelectric device. The method includes providing a piezoelectric material having a first surface and an opposing second surface, poling a first portion of the material to create a first polarity pointing from the first surface to the second surface, poling a second portion of the material adjacent to and distinct from the first portion to create a second polarity pointing from the second surface to the first surface, and electrically connecting the first and second portions at the first surface.

Another method of the present invention provides for making a piezoelectric device by providing a first piezoelectric device poled in a first direction thereby defining north and south surfaces of the first device, providing a second piezoelectric device poled in a second direction thereby defining north and south surface of the second device, disposing the first and second devices in a side-by-side arrangement on a surface, the first and second directions each being perpendicular to the surface, and electrically connecting the south surface of the first device to the north surface of the second device.

The above summary of the present invention is not intended to describe each disclosed embodiment or every implementation of the present invention. The Figures and the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
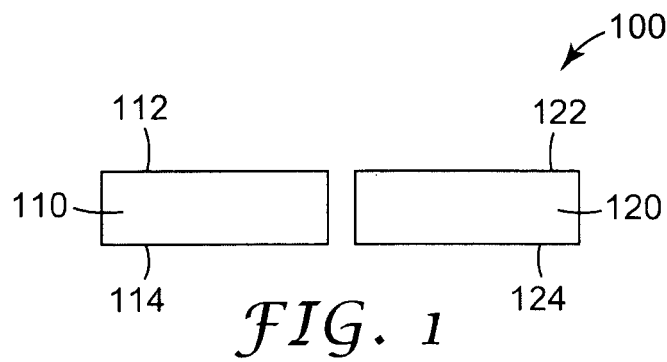
FIG. 1 is a schematic side view of a piezoelectric transducer that includes two distinct poled regions.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention relates to piezoelectric transducers, and particularly to poled piezoelectric transducers configured for enhanced voltage sensitivity when used as vibration sensors. In the present invention, two or more poled piezoelectric devices, or two or more poled portions of the same piezoelectric device, can be arranged in a side-by-side fashion and electrically connected so that the north pole of one device (or north pole of one portion of the same device), is connected to the south pole of another device (or south pole of another portion of the same device). A side-by-side arrangement indicates that the arrangement allows the devices (or portions thereof) to be individually mechanically coupled to the same surface. This can be contrasted to a stacked arrangement of devices, for example as with so-called bi-morph piezoelectric devices. A side-by-side arrangement of devices also indicates that the devices are positioned next to each other in any direction that is generally perpendicular to the poling directions of the devices.

The configuration of the present invention can enhance the voltage sensitivity of piezoelectric transducers relative to single, homogeneously poled piezoelectric transducers having similar overall dimensions and material properties. Devices of the present invention may be particularly suited to detecting bending wave vibrations, for example vibration-detecting touch input devices such as disclosed in WO 01/48684, U.S. 2002/0135570, WO 00/38104, and WO 02/01490, each of which is wholly incorporated into this document as if reproduced in full.

The poling directions of the piezoelectric transducers discussed herein are generally through the thickness of the devices, the thickness direction being generally perpendicular to the surface to which the transducer is or will be bonded. The orientation of the poling may either be top to bottom or alternatively the reverse (bottom to top). For ease of reference, the poling direction is referred to using the analogy of north/south directions normally associated with descriptions of magnets. A north facing pole corresponds to a bottom-to-top poling, in which case the top and bottom faces are referred to as the north and south faces, respectively. No magnetic properties are inferred by this description, which is used purely to aid a concise description of the invention.

Consider a single, homogeneously poled piezoelectric transducer mechanically coupled to the surface of a plate, the poling direction of the device being perpendicular to the surface of the plate. When the plate is impacted by an object, a vibration wave is created. When the vibrations reach the transducer, the transducer is stressed, creating a charge imbalance, and therefore a detectable voltage drop across the thickness of the transducer. As such, mechanical energy is translated into electrical energy. Because a piezoelectric transducer is a capacitor, the energy is proportional to $\frac{1}{2}C_o V_o^2$, where $C_o$ is the capacitance of the transducer, and $V_o$ is the voltage drop across the transducer.

Now consider a second piezoelectric transducer identical to the first except that one half of the transducer is poled oppositely the other half of the transducer, and these halves are electrically connected in series from the north pole of one half to the south pole of the other. When mechanically coupled to the same surface of the same plate, this second transducer converts the same vibrations into the same electrical energy. However, because the two halves are connected in series, each half having the half the capacitance as the original transducer, or $\frac{1}{2}C_o$, the overall capacitance of the second device is $C_N=\frac{1}{4}C_o$, due to how the capacitances of capacitors connected in series are added, to wit:

$$\frac{1}{C_N} = \frac{1}{\frac{1}{2}C_o} + \frac{1}{\frac{1}{2}C_o}.$$

As such, because the capacitance of the second transducer is reduced to $\frac{1}{4}C_o$, the voltage sensitivity, $V_N$, of the second transducer is increased two-fold (i.e., $V_N=2V_o$) to maintain the same energy output, as determined by the relationship $\frac{1}{2}C_N V_N^2=\frac{1}{2}C_o V_o^2$. In general, any side-by-side configuration of piezoelectric devices or regions connected in series with pole reversal through the series connections will result in increased voltage sensitivity, particularly to vibration sensing, relative to a single, homogeneously poled transducer having the same overall dimensions and materials properties.

FIG. 1 schematically shows a device 100 that includes two poled piezoelectric regions 110 and 120 in a side-by-side arrangement. Region 110 includes a first surface 112 and a second surface 114, and has a poling direction that points from one of these surfaces to the other. Region 120 includes a first surface 122 and a second surface 124, and has a poling direction that points from one of these surfaces to the other. Although regions 110 and 120 are shown separated, they can also be distinct regions formed in a single piece of material. Regions 110 and 120 can be connected in series so that the north pole of one region is connected to the south pole of the other region. This can be accomplished in a variety of ways, as illustrated in discussions that follow.

Piezoelectric transducers of the present invention include poled devices, which generally encompass all piezoelectric materials. Examples of piezoelectrics include the following: lead-zirconate-titanate (PZT), which is a ferroelectric piezoelectric, typically polycrystalline; quartz, which is a single crystal piezoelectric; barium titanate, which is a piezoelectric that is generally used in polycrystalline form (similar to PZT), although it can also be used in single crystal form; and polyvinylidene fluoride (PVDF), which is a polymer piezoelectric generally formed as a film.

Piezoelectric materials can be poled in a variety of ways, as will be understood by one of skill in the art. For example, electrodes can be disposed on opposing surfaces of a piece of piezoelectric material. A voltage drop can be induced across the electrodes such that the electric field is sufficient to permanently pole the material. Multiple regions of the same piece of material can be separately poled simultaneously or sequentially using electrodes that span only the region(s) to be poled and applying voltages of appropriate polarity across the various electrode pairs.

Figure 2:
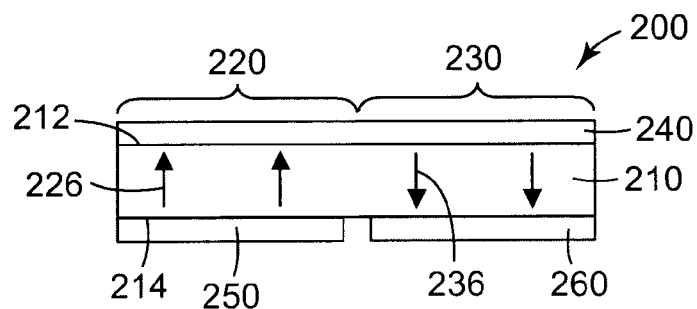
FIG. 2 is a schematic side view of an embodiment of a piezoelectric transducer according to the present invention.

FIG. 2 schematically shows a piezoelectric transducer 200 according to the present invention that includes a piezoelectric material 210 that include two distinctly poled regions 220 and 230. Region 220 has a poling direction 226 that points from first surface 214 to second surface 212. Region 230 has a poling direction 236 that points from second surface 212 to first surface 214. A single electrode 240 is disposed over surface 212 in such a manner that regions 220 and 230 are electrically connected in series from the north pole of region 220 to the south pole of region 230. As shown, common electrode 240 covers the entire surface 212, although the present invention contemplates any and all embodiments where electrode 240 covers a sufficient portion of surface 212 to electrically connect regions 220 and 230. A first terminal electrode 250 is disposed on surface 214 only within the first region 220. A second terminal electrode 260 is disposed on surface 214 only within the second region 230. The terminal electrodes allow for connection to wires or conductive traces for communication of signals to and/or from controller electronics.

Because both terminal electrodes 250 and 260 are disposed on the same surface of the transducer 200, it may be convenient to mechanically couple transducer 200 to a surface with the terminal electrodes oriented toward the surface. In this way, wires or conductive traces can be patterned or otherwise disposed on the surface so that when transducer 200 is mechanically coupled to the surface, the terminal electrodes make electrical contact with the wires or traces. Contact pads on the surface as well as solder, conductive paste, conductive adhesive, or any other suitable material can be used to aid the electrical connection to the terminal electrodes. In exemplary embodiments, a conductive adhesive can be used to electrically couple the terminal electrodes to the signal carriers (e.g., wires, conductive traces, etc.) and to mechanically couple the transducer to the surface. For example, a z-axis conductive adhesive can be used so that the entire bottom portion of the transducer can be mechanically coupled while maintaining appropriate electrical isolation between pairs of the terminal electrodes and signal carriers.

Figure 3:
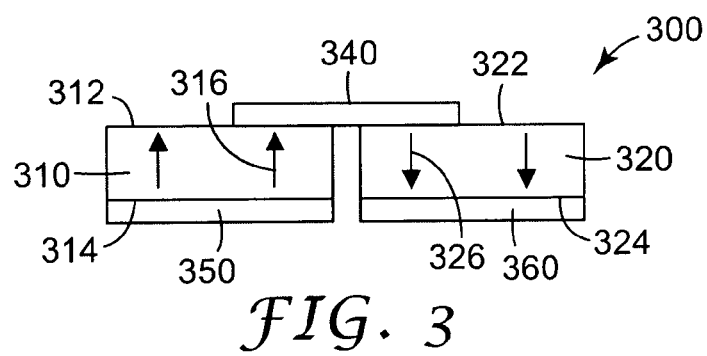
FIG. 3 is a schematic side view of an embodiment of a piezoelectric transducer according to the present invention.

FIG. 3 schematically shows another piezoelectric transducer 300 according to the present invention that includes a first piezoelectric device 310 and a second piezoelectric device 320 disposed in a side-by-side arrangement. First device 310 has a poling direction 316 that points from a first surface 314 to a second surface 312. Second device 320 has a poling direction 326 that points from a second surface 322 to a first surface 324. Electrode 340 is disposed to electrically connect the second surface 312 of the first device 310 to the second surface 322 of the second device 320, thereby connecting in series the north pole of the first device 310 to the south pole of the second device 320. A first terminal electrode is disposed on first surface 314 of device 310, and a second terminal electrode is disposed on first surface 324 of device 320. In exemplary embodiments where transducer 300 is used for vibration detection, devices 310 and 320 are disposed in close enough proximity that both devices can be used together to detect vibrations within a desired wavelength range. While transducer 300 is constructed from separate devices 310 and 320, it is functionally similar to transducer 200, and shares the aspect of being able to electrically connect both terminal electrodes on the same side of the device, preferably on the surface to which the transducer is mechanically coupled.

Figure 4:
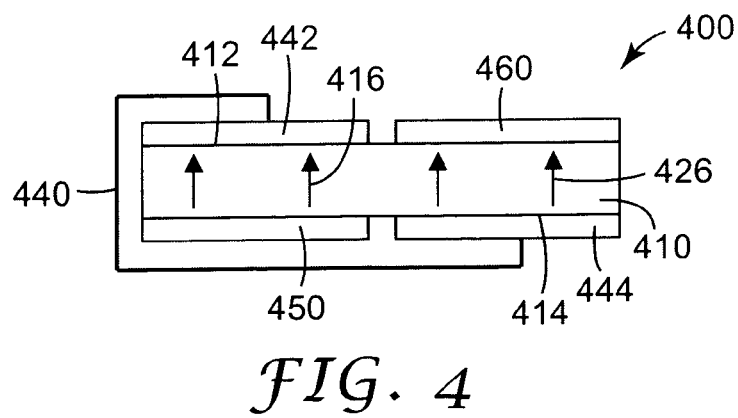
FIG. 4 is a schematic side view of an embodiment of a piezoelectric transducer according to the present invention.

FIG. 4 shows another piezoelectric transducer 400 according to the present invention that includes a single piezoelectric device 410 that is homogeneously poled having a poling direction 416 pointing from first surface 414 to second surface 412. Although transducer 400 is homogeneously poled, it forms two distinct poling regions by use of distinct electrodes and a particular electrode connection arrangement. As shown, electrodes 442 and 450 span approximately one half of the device, electrode 442 being disposed on second surface 412 and electrode 450 being disposed on first surface 414. Similarly, electrodes 460 and 444 span approximately the other half of the device, electrode 460 being disposed on second surface 412 and electrode 444 being disposed on first surface 414. While the electrode arrangement shown approximately divides the transducer 400 into halves, other arrangements can be used, including dividing the transducer into more than two symmetric portions or dividing the transducer into two or more non-symmetric portions. Electrodes 442 and 444 are connected together by common connector 440, which may take the form of a wire or other conductive trace that is soldered or otherwise suitably connected at one end to electrode 442 and at the other end to electrode 444. This common connection electrically connects the two halves in series while reversing the polarity of the device between the connections so that the north pole of one half of transducer 400 is connected to the south pole of the other half. Electrodes 450 and 460 are terminal electrodes for carrying signals to and from transducer 400.

While FIG. 4 shows a configuration using a single piezoelectric device 410, a similar configuration can be constructed using separate devices disposed in a side-by-side relationship, each having parallel poling directions, but with the north pole of one device being connected in series to the south pole of the next adjacent device. Again, any number of devices can be used to construct a series chain, the first and last devices of a chain having the terminal electrodes.

Figure 5:
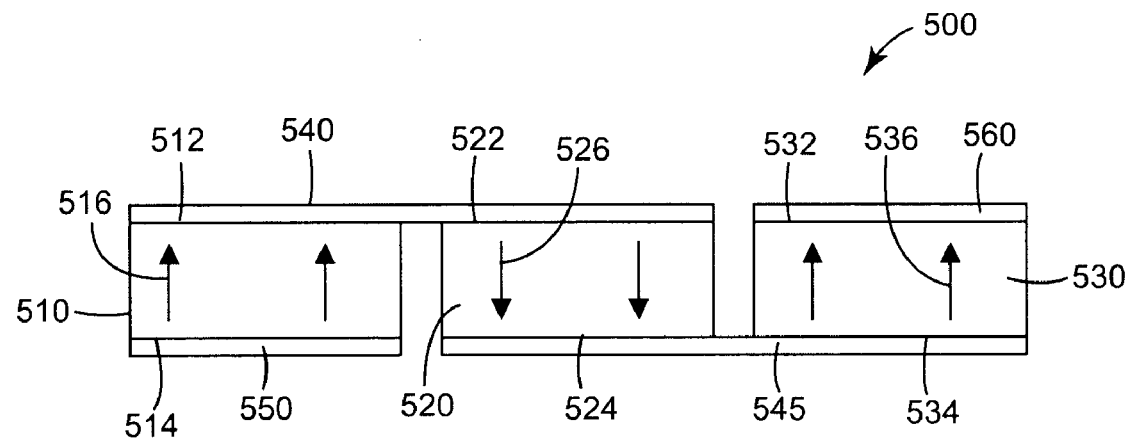
FIG. 5 is a schematic side view of an embodiment of a piezoelectric transducer according to the present invention.

FIG. 5 shows another piezoelectric transducer 500 according to the present invention that includes three piezoelectric devices 510, 520, and 530 disposed in a side-by-side relationship, preferably in close proximity. First device 510 has a poling direction 516 that points from first surface 514 to second surface 512. Second device 520 has a poling direction 526 that points from second surface 522 to first surface 524. Third device 530 has a poling direction 536 that points from first surface 534 to second surface 532. The devices are arranged so that a first common electrode 540 can be disposed on surfaces 512 and 522, and a second common electrode 545 can be disposed on surfaces 524 and 534. Electrode 540 connects devices 510 and 520 so that the north pole of device 510 connects to the south pole of device 520. Electrode 545 connects devices 520 and 530 so that the north pole of device 520 connects to the south pole of device 530. In this way, the devices are connect in series with a pole reversal at each series connection. First terminal electrode 550 is disposed on surface 514 of device 510 and second terminal electrode 560 is disposed on surface 532 of device 530. The terminal electrodes can be used to communicate signals to and from the transducer.

Figure 6:
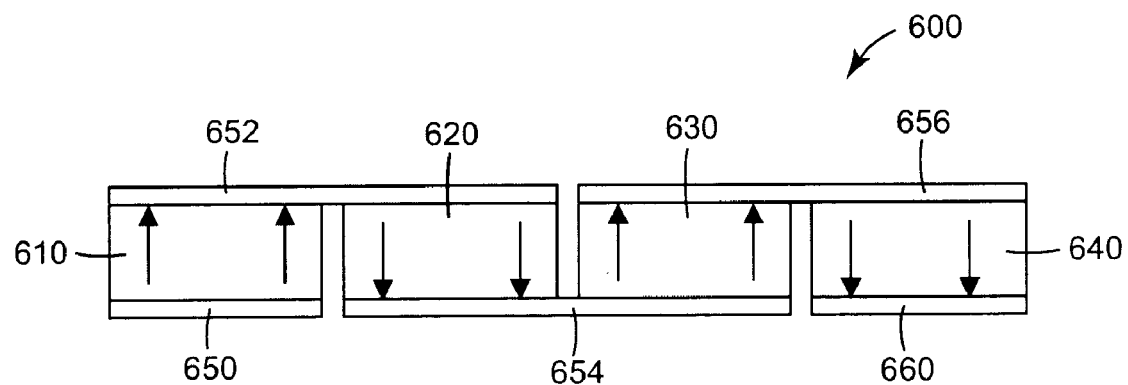
FIG. 6 is a schematic side view of a piezoelectric transducer according to the present invention.

FIG. 6 shows another piezoelectric transducer 600 according to the present invention that includes four piezoelectric devices 610, 620, 630, and 640 disposed in a side-by-side relationship, preferably in close proximity. The poling directions for each of the devices are indicated by arrows. Adjacent devices have opposite polarity so that common electrodes can be used to simply connect adjacent devices in series with a pole reversal. As such, common electrode 652 is disposed to connect the north pole of device 610 to the south pole of device 620. Common electrode 654 is disposed to connect the north pole of device 620 to the south pole of device 630. Common electrode 656 is disposed to connect the north pole of device 630 to the south pole of device 640. A first terminal electrode 650 is disposed on the south pole of device 610, and a second terminal electrode 660 is disposed on the north pole of device 660. This transducer arrangement also allows signal carrier connections to be made to the terminal electrodes at the same surface to which the transducer is bonded or otherwise mechanically coupled.

Figure 7A:
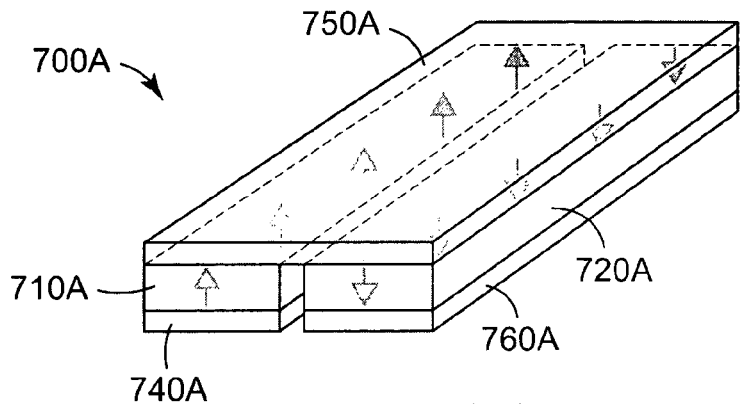
FIG. 7(a) is a schematic view of an embodiment of a piezoelectric transducer according to the present invention.
Figure 7B:
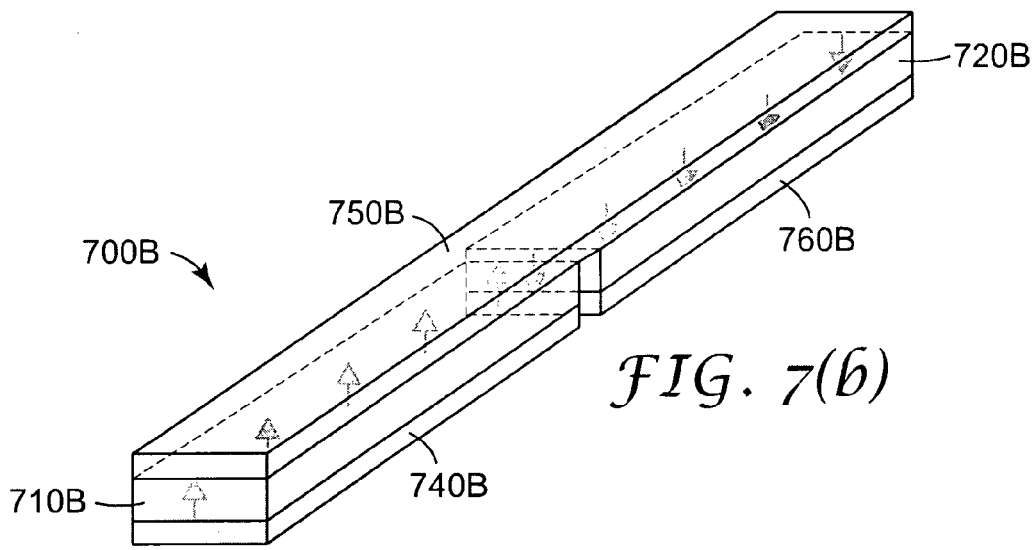
FIG. 7(b) is a schematic view of an embodiment of a piezoelectric transducer according to the present invention.

It will be recognized that the side-by-side piezoelectric device arrangements described with reference to FIGS. 1-6 are merely illustrative of various possible configurations, and not exhaustive. Any suitable side-by-side arrangement of piezoelectric devices or regions that allow for devices to be electrically connected in series with a pole reversal between connected devices can be used with any suitable number of two or more piezoelectric devices or regions. For examples, FIGS. 7(a) and 7(b) show two of the various possible side-by-side arrangements of elongated piezoelectric devices. FIGS. 7(a) and 7(b) indicate specific configurations of the general arrangement shown in FIG. 3. FIG. 7(a) shows a transducer 700A that includes two piezoelectric devices 710A and 720A disposed in a side-by-side arrangement, the devices having opposite polarities. Devices 710A and 720A are elongated and spaced apart along their short axes. The north pole of device 710A is connected to the south pole of device 720A by a common electrode 750A. Terminal electrodes 740A and 760A are disposed on the lower surfaces of devices 710A and 720A, respectively. FIG. 7(b) shows a transducer 700B that includes two piezoelectric devices 710B and 720B disposed in a side-by-side arrangement, the devices having opposite polarities. Devices 710B and 720B are elongated and spaced apart along their long axes. The north pole of device 710B is connected to the south pole of device 720B by a common electrode 750B. Terminal electrodes 740B and 760B are disposed on the lower surfaces of devices 710B and 720B, respectively.

While transducers 700A and 700B are each shown as made up of separate piezoelectric devices, it is also contemplated that that transducers 700A and 700B can be constructed from single piezoelectric devices having separate poled regions. In embodiments where transducers 700A and 700B are made up of separate piezoelectric devices, the choice of whether to use a transducer construction like transducer 700A may depend on the desired orientation of the transducer as well as details of the specific application such as the direction along which stresses are to be measured. In the case of elongated transducers located in the corners of a rectangular plate and oriented with the long axes of the transducers pointing toward the center of the plate, the transducers intended for sensing stresses due to vibrations propagating in the plate, it may be desirable to use transducers such as transducer 700A because of the structurally integral along the long direction, which is the likely direction along which the stresses would be measured.

Figure 8:
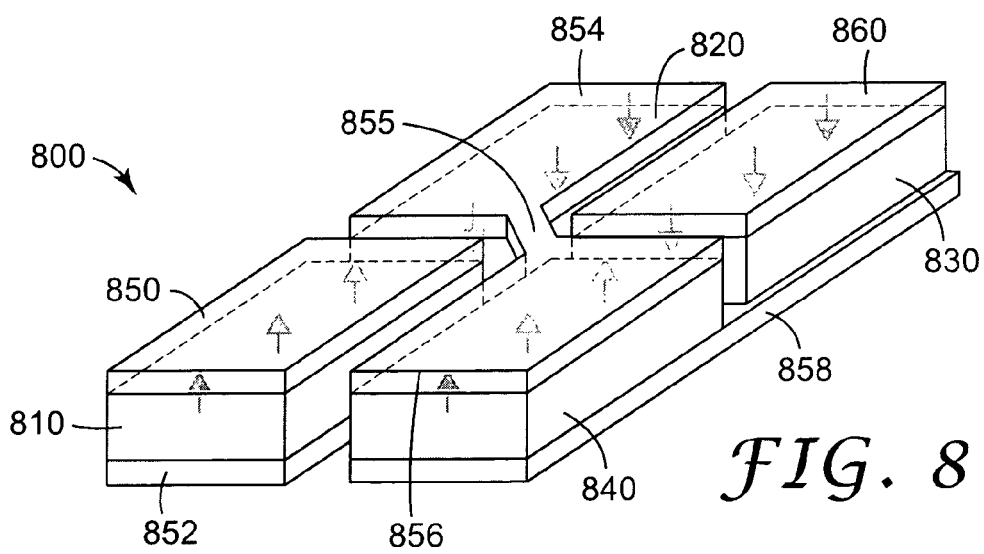
FIG. 8 is a schematic view of an embodiment of a piezoelectric transducer according to the present invention.

FIG. 8 shows another piezoelectric transducer 800 of the present invention that includes four piezoelectric devices 810, 820, 830, and 840 disposed in a side-by-side rectangular arrangement so that each device is adjacent to the other three. The devices are poled as indicated by the arrows. The south pole of device 810 is connected to the north pole of device 820 via common electrode 852. The south pole of device 820 is connected to the north pole of device 840 via bridge electrode 855, which spans the corner-to-corner gap between devices 820 and 840, connecting electrode 854 on device 820 to electrode 856 on device 840. The south pole of device 840 is connected to the north pole of device 830 via common electrode 858. A first terminal electrode 850 is disposed on the north pole surface of device 810, and a second terminal electrode 860 is disposed on the south pole surface of device 830. First terminal electrode 850 and second terminal electrode 860 are disposed on the same side of transducer 800, allowing the transducer to be electrically connected to both terminal electrodes on the same surface, preferably the surface to which the transducer is bonded. While the configuration of transducer 800 is similar to a two-dimensional array, as compared to a linear chain, transducer 800 can be considered as one example of the functional arrangement shown in FIG. 6.

The various transducer configurations shown in FIGS. 1-8 indicate some of the possible design choices in arranging piezoelectric devices and regions to make transducers of the present invention. These design choices include using separately poled regions of the same piezoelectric material versus using separate poled piezoelectric devices, orienting adjacent devices or regions of the same device to have the same or opposite polarity, using two or more piezoelectric regions or devices or combinations thereof, using linear chains or two-dimensional arrays of regions or devices, orienting elongated regions or devices to be positioned side-by-side along their short or long axes or along a different direction in the plane, choosing one or more piezoelectric materials, and so forth. Other configuration design choices not specifically shown or identified will be understood and appreciated by the descriptions provided herein. Each of these design choices can be used alone or in combination to make transducers according to the present invention.

Piezoelectric transducers of the present invention can be mechanically bonded or otherwise coupled to a surface of an object, such as a plate, and used for particular advantage to detect vibrations such as bending waves propagating through the object. The transducers can also be used to drive vibrations into the object, for example for sensing the emitted vibrations by other transducers and/or for measuring changes to the emitted vibrations due to interactions between the object an external signals or stimuli.

Figure 9:
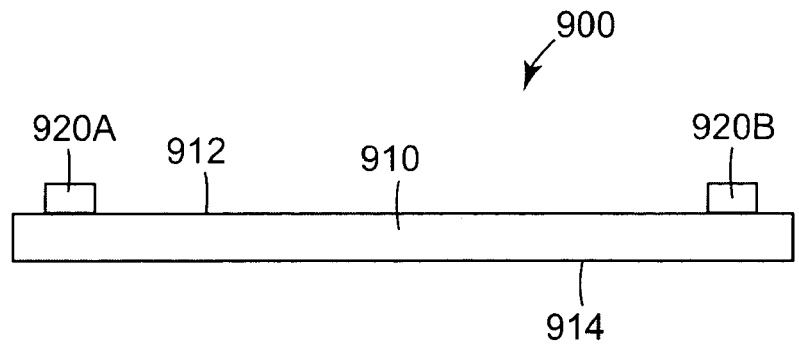
FIG. 9 is a schematic view of an embodiment of a vibration sensing and/or emitting device utilizing piezoelectric transducers according to the present invention.

FIG. 9 shows a schematic side view of a device 900 that includes piezoelectric transducers 920A and 920B disposed on surface 912 of a plate 910. Transducers 920A and 920B can be transducers according to the present invention. Device 900 is shown for illustrative purposes, and it will be understood that fewer or more transducers can be utilized, and that the transducers can be disposed on the same or different surfaces of the plate, for example on surface 912 and surface 914. Each of transducers 920A and 920B can be configured to emit and/or receive vibrations, thereby causing and/or sensing bending waves in the plate 910. For example, device 900 can be a touch-sensing device whereby the interactions of a touch implement with surface 912 or surface 914 causes vibrations that can be sensed by transducers 920A and 920B. Such vibrations may be due to an impact of the touch implement on the surface, or by frictional movement of the touch implement across the surface. The sensed vibrations can be used to determine the position of the touch input, for example as described in WO 01/48684. In addition, either or both of transducers 920A and 920B can emit vibrations that can be reflected, attenuated, or otherwise altered by a touch input to surface 912 or surface 914. Either or both of transducers 920A and 920B can then be used to sense the altered emitted vibration to determine information related to the touch input such as the position of the touch, for example as described in WO 01/48684. Device 900 can be any other suitable device for receiving or emitting plate vibrations, such as a panel-type microphone, a panel-type loudspeaker, or the like. Plate 910 can be any material capable of supporting the vibrations to be sensed and/or emitted. Preferably, plate 910 is a rigid plate, and can be any suitable material such as glass, plastic (polyacrylate, polycarbonate, etc.), wood, cardboard, metal, or the like. Transducers 920A and 920B can be bonded to plate 910 by any suitable means, for example using an adhesive.

Figure 10:
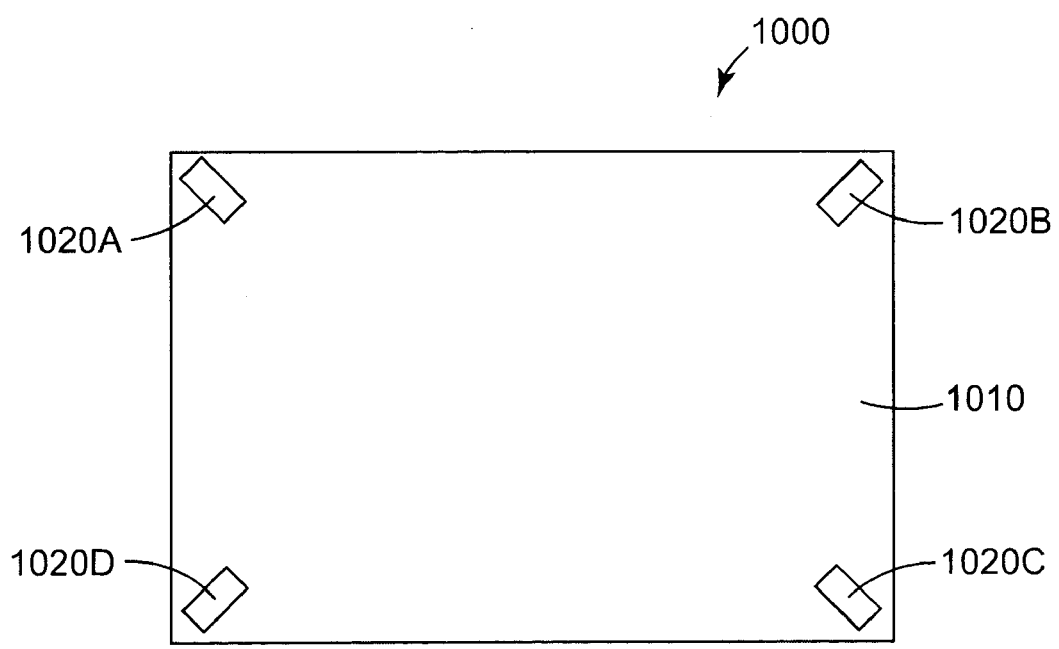
FIG. 10 is a schematic plan view of an embodiment of a vibration-sensing touch input device according to the present invention.

When transducers of the present invention are used in a touch-activated user input device that senses vibrations caused or affected by a touch input, it may be desirable to dispose four sensing transducers, one in each corner, of a rectangular plate, the rectangular plate defining a touch surface. For example, FIG. 10 shows a schematic plan view of vibration-sensing touch sensor 1000 that includes transducers 1020A-1020D disposed one in each corner of a touch plate 1010. The transducers can be disposed on top of or underneath the touch plate 1010. In the embodiment shown, each of the transducers 1020A-1020D are elongated, their respective long axes forming nearly 45 degree angles with the sides of the plate. This can give the device a measure of symmetry in its response to incoming vibrations. Exemplary transducers are elongated and have a 2:1 to 5:1 aspect ratio, the individual poled regions of the transducers being disposed in a side-by-side relationship along the long axis of the transducer. In some embodiments, each of the transducers 1020A-1020D can be used for sensing vibrations. In some embodiments, at least one of the transducers 1020A-1020D can be used to emit vibrations. Additionally or alternatively, one or more other piezoelectric devices (not shown) can be used to emit vibrations, for example as a dedicated function, which can allow transducers 1020A-1020D to be dedicated to a sensing mode.

In some embodiments such as shown in FIGS. 9 and 10, signals are carried to and from the transducers using wires or patterned conductive traces, for example conductive traces printed on the plate to which the transducers are mechanically coupled. In some cases, the capacitance of the conductive wires or traces can act to reduce the output voltage of the piezoelectric transducers by, in effect, increasing the capacitance of the transducers. This effect can be countered by adding amplifiers between the transducers and the signal carrying wires or traces. For example, amplifiers can be provided directly on the surface to which the transducers are bonded, one amplifier per transducer, for example, the amplifiers located adjacent to their corresponding transducers. The signal carrying wires or traces can be coupled to the transducers through the amplifiers in such a way that the amplifiers buffer the voltages generated by the transducers. This can greatly reduce potential losses of voltage sensitivity. The buffer amplifiers can also reduce the impedance driving the wires or printed conductive traces, potentially resulting in improved performance in terms of noise pickup.

Piezoelectric transducers of the present invention can be bonded to surfaces and electrically connected to signal carriers in any suitable manner. In the case of a transducer that includes both terminal electrodes on the same side of the device, it may be desirable to bond the transducer to a surface such that the side of the transducer that includes the terminal electrodes is bonded to the surface. Signal carriers such as wires or conductive traces can be provided such that when the transducer is placed and bonded to the surface, proper electrical contacts are made. Electrical contact can be aided by the use of a conductive material such as a solder, conductive paste, conductive adhesive such as silver-filled epoxy, or the like. One particular example of a suitable conductive adhesive is a polymer thick film silver epoxy ink such as that sold under the trade designation ERCON 5600 A/B by Ercon, Inc. In some cases, a conductive adhesive can be placed on each of the terminal electrodes of the transducer, and a non-conductive adhesive can be placed on the remainder of the bottom surface of the transducer. Examples of non-conductive adhesives include various epoxies, urethanes, and cyanoacrylate (isocyanate) adhesives. In other cases, just the conductive adhesive can be used. For example, a conductive adhesive can be dispensed only in those areas where electrical contact is to be made between the transducers and the signal carriers. In such a case, only selected portions of the transducers are bonded to the surface. Exemplary conductive adhesives for use in such an assembly include silver epoxies available from Epoxy Technology, Inc., including those sold under the trade designations E2001, EM127 and H20E-PFC. In other embodiments, a z-axis conductive adhesive, or anisotropic conductive adhesive, can be used. A z-axis conductive adhesive can be placed in selected areas or in the entire area covered by the transducer. A z-axis conductive adhesive provides for electrical connections through the thickness of the adhesive layer and substantially prevents electrical connections in the plane of the adhesive layer to inhibit crosstalk between the terminal electrodes and signal carriers.

When making a vibration sensing touch panel device, a substrate can be provided that supports vibration propagation. The substrate will become the touch plate for the touch panel device. Preferably, the substrate is rectangular. The substrate can be formed, sized, and cut before performing the additional steps or can be cut to size after placing any or all of the wires or conductive traces, transducers of the present invention, an optional electrical tail, and so forth. Optionally, the substrate can be coated to provide an anti-glare or anti-reflective finish, a textured surface, or other optical or otherwise functional elements.

Wires or conductive traces can be provided on the substrate to lead from the areas where the transducers are to be placed to an area where an electrical connection can be made to couple the wires or conductive traces to controller electronics. A pair of wires or traces can be provided for each transducer, one of the wires or traces in each pair being placed to electrically connect with one or the other of the terminal electrodes of each transducer. Before, after, or during patterning of the wires or traces, an optional conductive material can be dispensed to aid in making an electrical connection. For example, a solder, a conductive adhesive, a conductive grease, or another suitable conductive material can be dispensed on the substrate in the areas where contact is to be made, or directly on the terminal electrodes of the transducers. Prior to placing the transducers in the selected sensor areas, an adhesive material may also be dispensed onto the substrate, onto the transducers, or both, to aid in affixing or bonding of the transducers to the substrate so the transducers can be mechanically coupled to the substrate. The adhesive material can be any suitable adhesive material, and may require a further step of curing by heating, exposure to radiation, or other means. The transducers can then be placed on the selected areas of the substrate and affixed.

An electrical tail having leads to connect to each of the wires or patterned traces can be attached to the touch panel. The tail can be attached before or after the wires are patterned, and a conductive material may be used to aid in electrically connecting the leads of the tail to the wires or patterned traces.

Figure 11:
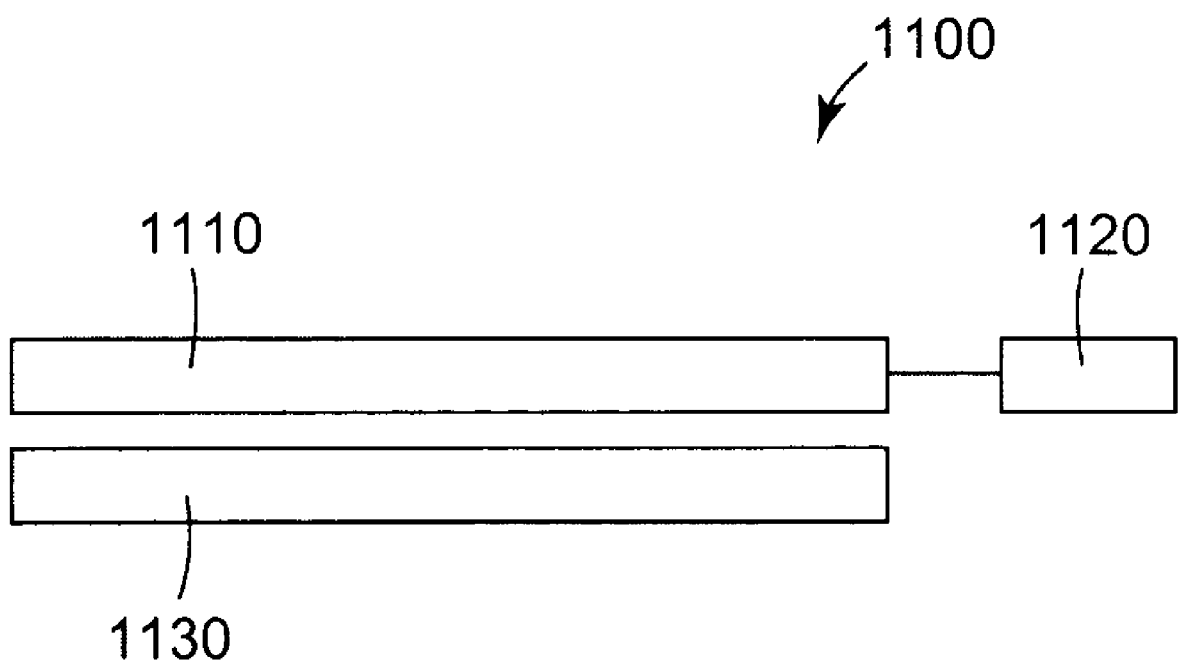
FIG. 11 is a schematic view of an embodiment of a touch sensor system according to the present invention.

FIG. 11 schematically shows a touch sensor system 1100 that includes a vibration-sensing touch sensor 1110 that includes piezoelectric transducers according to the present invention. The piezoelectric transducers of touch sensor 1110 are coupled to control electronics 1120 that can be located near the transducers (for example on the same touch plate or on a circuit board connected to the touch plate) or remotely from the transducers (for example on a control board in a computer attached to the touch sensor). Optionally, touch sensor 1110 can be disposed over a display 1130 so that the display can be viewed through the touch sensor 1110. In other embodiments, touch sensor 1110 can be located away from the display 1130, such as for a touch pad used to control the cursor on the display screen of a laptop computer. Display 1130 can be an electronic display such as a liquid crystal display, an organic electroluminescent display, a light emitting diode display, a cathode ray tube display, a plasma display, or the like. Display 1130 can also include static graphics or other indicia.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

What is claimed is:

1. A user input device comprising:
   a touch plate; and
   at least one piezoelectric transducer comprising a series of poled piezoelectric regions disposed in a side-by-side arrangement on a surface of the touch plate, each region having a poling direction defined by a north pole and a south pole, the poling direction of each region being perpendicular to the surface of the touch plate, the regions connected in series such that the north pole of one region is electrically connected to the south pole of the next region in the series.

2. The user input device of claim 1, comprising two or more piezoelectric transducers.

3. The user input device of claim 1, wherein the touch plate is rectangular, and comprising at least four piezoelectric transducers, one of which is positioned at each of the corners of the touch plate.

4. The user input device of claim 1, wherein the at least one piezoelectric transducer is configured to detect vibrations in the touch plate.

5. The user input device of claim 4, further comprising controller electronics coupled to receive signals from the at least one piezoelectric transducer, the controller electronics configured to determine information relating to the vibrations in the touch plate.

6. The user input device of claim 5, comprising at least three piezoelectric transducers, wherein the controller electronics are coupled to receive signal from the at least three piezoelectric transducers.

7. The user input device of claim 6, wherein controller electronics are configured to determine the position of a touch to the touch plate when the vibrations in the touch plate are induced by the touch to the touch plate.

8. The user input device of claim 1, wherein the at least one piezoelectric transducer is configured to emit vibrations into the touch plate.

9. The user input device of claim 1, wherein the at least one piezoelectric transducer further comprises first and second terminal electrodes electrically connected to a first and second signal carrier, respectively, for communicating electrical signals to and from the transducer.

10. The user input device of claim 9, wherein one of the first and second signal carriers is electrically connected to the transducer through an amplifier.

11. A method for making a piezoelectric device, comprising:

providing a first piezoelectric device poled in a first direction thereby defining north and south surfaces of the first device;

providing a second piezoelectric device poled in a second direction thereby defining north and south surface of the second device;

disposing the first and second devices in a side-by-side arrangement on a surface, the first and second directions each being perpendicular to the surface; and electrically connecting the south surface of the first device to the north surface of the second device in a manner that provides increased voltage sensitivity of the device to bending wave vibrations relative to the first and second devices if poled in the same direction.

* * * * *